United States Patent
Wakino

[11] 4,314,213
[45] Feb. 2, 1982

[54] THROUGH-TYPE CAPACITOR

[75] Inventor: Kikuo Wakino, Muko, Japan

[73] Assignee: Murata Manufacturing Co., Ltd., Japan

[21] Appl. No.: 24,023

[22] Filed: Mar. 26, 1979

[30] Foreign Application Priority Data

Mar. 30, 1978 [JP] Japan .................. 53-42156[U]

[51] Int. Cl.³ .................. H03H 3/00; H03H 7/01; H01G 4/42; H01G 1/02
[52] U.S. Cl. .................. 333/182; 29/25.42; 333/184; 333/185; 361/302; 361/307; 361/311
[58] Field of Search .................. 333/181–185; 361/301–316; 339/147 R; 29/25.42

[56] References Cited

U.S. PATENT DOCUMENTS

| | | | |
|---|---|---|---|
| 2,756,375 | 7/1956 | Peck | 361/302 |
| 2,922,936 | 1/1960 | Dehn et al. | 361/302 |
| 2,973,490 | 2/1961 | Schlicke | 333/182 |
| 2,983,855 | 5/1961 | Schlicke | 361/302 |
| 3,023,383 | 2/1962 | Schlicke | 333/182 |

Primary Examiner—Marvin L. Nussbaum
Attorney, Agent, or Firm—Ostrolenk, Faber, Gerb & Soffen

[57] ABSTRACT

An improved through-type capacitor for use in electrical and electronic equipment which includes a metallic housing having upper and lower openings through a stepped portion, a capacitor element accommodated in the upper opening and further including a disc member with a central bore and electrodes provided on its opposite surfaces, a central conductor inserted through the central bore of the disc member so as to be secured for being electrically connected to one of the electrodes, with the other of the electrodes being electrically connected to the stepped portion of the housing, an electrically insulating support plug extended through by the central conductor and fixed to the lower opening, and resin material filled in the upper opening of the housing.

10 Claims, 6 Drawing Figures

THROUGH-TYPE CAPACITOR

BACKGROUND OF THE INVENTION

The present invention relates to a capacitor and more particularly, to a through-type capacitor for use in electrical and electronic equipment.

Following the recent tendency to miniaturization of circuit construction for various electrical and electronic equipment and devices, capacitors of compact size, especially through-type capacitors, have been widely employed in various fields of electrical and electronic industries.

Referring to FIG. 1, there is shown the construction of a known through-type capacitor, which generally comprises an annular metallic housing H having an upper opening Ho1 and a lower opening Ho2 with a smaller diameter than Ho1; a capacitor element EC including a disc D of ceramic dielectric material which has a central bore Do; a ring-shaped electrode e1 provided around the central bore Do at the upper surface of the disc D; another ring-shaped electrode e2 provided on the lower surface of the disc D adjacent to the peripheral edge thereof and which is accommodated in the opening Ho1 of the housing H; and a central rod-shaped conductor member A inserted into the central bore Do of the disc D, in which position it is secured. The central conductor member A is electrically and mechanically connected, at its collar portion Ac, to the electrode e1 by soldering or the like as at e1s, while the bottom Ha of the housing H between the openings Ho1 and Ho2 is also electrically and mechanically connected to the electrode e2 by soldering or the like as at e2s. The housing H is filled with resin material r, which serves both as electrical insulation and as outer cladding.

The conventional through-type capacitor as described in the foregoing, although extremely simple in its structure, has various disadvantages.

(i) When the through-type capacitor is to be attached, for example, to an electronic equipment chassis (not shown), the solder e2s connecting the metallic housing H and the electrode e2 tends to melt due to the heat of the soldering iron or other instrument used which can cause shortcircuiting between the central conductor member A and the metallic housing H.

(ii) To extend the working frequency of the above kind of through-type capacitor to the GHz range, it is necessary to reduce the thickness of the ceramic dielectric disc D to the order of 200μ. When the capacitor element Ec is so thin, it may in some cases crack when the lower end portion of the central conductor member A is bent toward the left or right for connection to a circuit (not shown).

(iii) The work of filling the metallic housing H with resin r especially through the lower opening Ho2, is very difficult due to the small diameter of the opening Ho2, etc., and hardening of the resin tends to be insufficient in some cases, resulting in reduction of withstand voltage or poor insulation, unless resin material r is inserted at least three times. Moreover, when resin material r is inserted via both the upper and lower openings Ho1 and Ho2, the resin material inserted through one hole must be sufficiently dried before resin can be inserted through the other, and thus, extra working hours are required, with consequent increase of the manufacturing cost.

SUMMARY OF THE INVENTION

Accordingly, an essential object of the present invention is to provide an improved through-type capacitor for use in electrical and electronic equipment which is durable and strong in construction, and readily applicable to various electrical and electronic equipment.

Another important object of the present invention is to provide an improved through-type capacitor of the above described type which is simple in structure and stable in functioning, and can be manufactured on a large scale at low cost, with substantial elimination of the disadvantages inherent in conventional through-type capacitors of the kind described above.

A further object of the present invention is to provide a method of efficiently manufacturing an improved through-type capacitor of the above-described type.

In accomplishing these and other objects, according to one preferred embodiment of the present invention, there is provided a through-type capacitor for use in electrical and electronic equipment which comprises a cylindrical housing of metallic material having its top open and having a relatively small opening in its bottom; a capacitor element including a disc member of dielectric material with a central bore, provided with electrode members on its opposite surfaces and accommodated in the first opening of the housing and secured to the housing bottom; a central conductor member inserted through and secured to the central bore of the disc member. One of the electrodes is electrically connected to the central conductor, and the other electrode is electrically connected to the bottom of the housing. A support plug member through which the central conductor member extends is fixed to the housing near the second opening and the housing is partly filled with, resin material inserted through the first opening.

By the arrangement described above, a sturdy, durable through-type capacitor of simple construction and without the disadvantages inherent in the conventional through-type capacitor is provided.

BRIEF DESCRIPTION OF THE DRAWINGS

These and other objects and features of the present invention will become apparent from the following description taken in conjunction with the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 2:
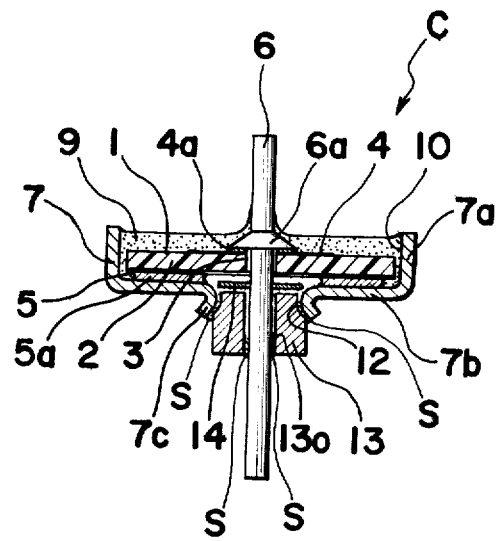
FIG. 2 is a side sectional view of an improved through-type capacitor according to one preferred embodiment of the present invention.

Referring now to the drawings, there is shown in FIG. 2 a through-type capacitor C according to one preferred embodiment of the present invention.

In FIG. 2, the through-type capacitor C generally includes a housing 7 of metallic material having an upper opening 10 defined by a peripheral wall 7a extending upwardly from the bottom 7b of the housing 7 and a lower opening 12 of a smaller diameter defined by a wall 7c concentric with wall 7a, extending downward and slightly outward from the central of the bottom portion 7b of the housing 7. Opening 10 of the housing 7 accommodates a capacitor element 1 including a disc member 2 of ceramic dielectric material which has a central bore 3, a ring-shaped electrode 4 provided around the central bore 3 on the upper surface of the disc member 2. Another, coaxial ring-shaped electrode 5 is provided on the lower surface of the disc member 2 adjacent to the peripheral edge thereof, and a central conductor member 6 of rod shape is secured in the central bore 3 of the disc member 2. The central conductor member 6 is electrically and mechanically connected, at its collar portion 6a, to the electrode 4 by soldering or the like as at 4a, while the bottom 7b of the housing 7 between the openings 10 and 12 thereof is electrically and mechanically connected to the electrode 5 by soldering or the like as at 5a. Into the lower opening 12 is fitted an electrically insulating cylindrical support plug 13, with the lower end of the central conductor member 6 extending through a central bore $13_0$ of the plug 13. The space in the upper opening 10 is filled with resin material 9, with which the lower space between the wall defining the lower opening 12 and the support plug 13 and the lower space between the central conductor member 6 and the bore 13a of the support plug 13 can also be filled if necessary, to improve resistance against humidity. It is to be noted that, in the filling of the lower spaces as described above, the resin material 9 only has to be inserted into mouths S of the lower spaces for sufficient effect.

One example of a method of manufacturing the through-type capacitor C of FIG. 2 will now be described.

First, the insulating support plug 13 is fitted into the lower opening 12 of the housing 7 and fixed there. If it is required to further improve the electrical insulation, an electrically insulating sheet 14 is placed on top of the support plug 13, or insulating paint (not shown) is applied to the upper surface of the support plug 13 In the next step, an annular layer of solder 5a is deposited on the bottom 7b of the housing 7, and the capacitor element 1, with the electrodes 4 and 5 already mounted on the disc 2, is fitted into the upper opening 10 of the housing 7 and placed on the layer of solder 5a. Subsequently, the central conductor member 6 is inserted into the central bore 3 of the disc 2 and its collar 6a is placed on a ring of solder 4a, located on electrode 4. The through-type capacitor C thus assembled is then passed through a conveyor furnace (not shown) which is at a predetermined temperature to fuse the solder rings 4a and 5a, securing the collar portion 6a of the central conductor member 6 to the electrode 4 and the electrode 5 to the bottom 7b of the housing 7. Finally, the resin material 9 is inserted into the space in the upper opening 10 of the housing 7, and also, if it is necessary to improve the protection against humidity, into the mouths S of the spaces between the wall 7c defining the lower opening 12 and support plug 13 and between the central conductor member 6 and the central bore $13_0$ of the support plug 13.

Figure 1:
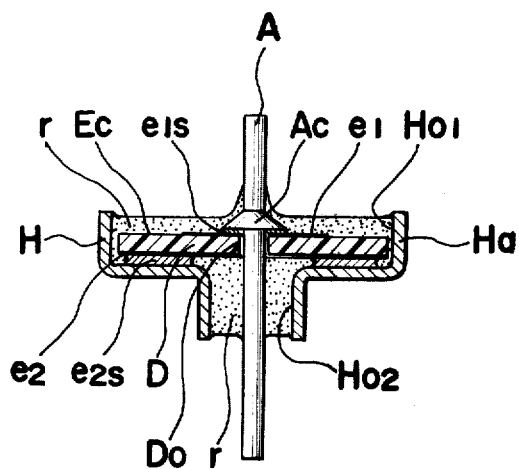
FIG. 1, already referred to, is a side sectional view of a conventional through-type capacitor.

It is to be noted here that in the arrangement of FIG. 2 according to the present invention, filling of the lower spaces S with the resin material 9 need not necessarily be perfect to provide adequate resistance against humidity and adequate electrical insulation, unlike the conventional arrangement of FIG. 1.

Figure 3:
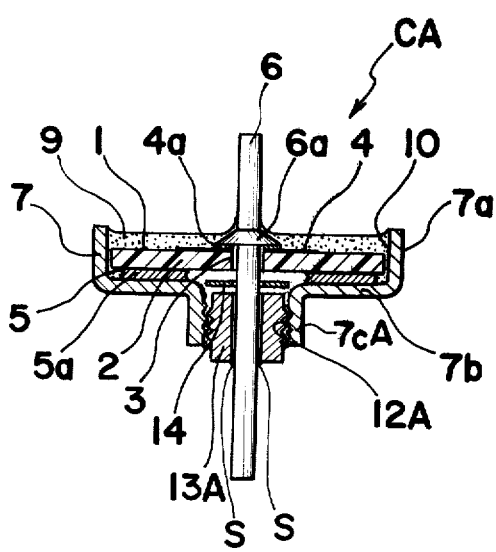
FIG. 3 is a view similar to FIG. 2, which particularly shows a modification thereof.

Referring to FIG. 3, there is shown a modification of the arrangement of FIG. 2. In the modified through-type capacitor CA of FIG. 3, the interior of housing wall 7cA immediately within the lower opening 12 is threaded, and the wall 7cA extends straight downward from the bottom 7b of the housing 7 instead of flaring as in FIG. 2, while the support plug 13 described as employed in the arrangement of FIG. 2 is replaced by a support plug 13A, which is externally threaded so as to be screwed into the lower opening 12A.

Figure 4:
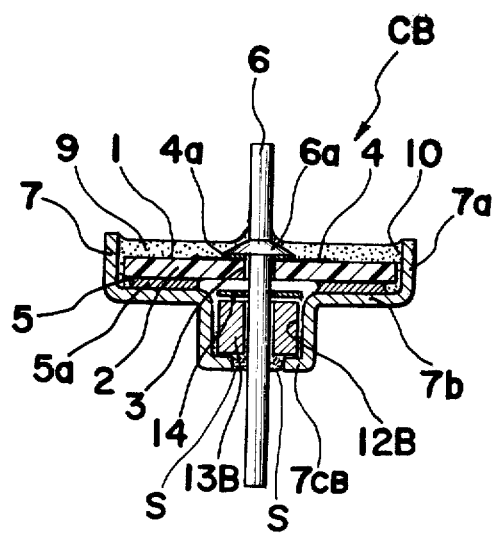
FIG. 4 is a view similar to FIG. 3, which particularly shows another modification thereof.

Alternatively, the lower opening 12A and corresponding support plug 13A may further be modified as shown in FIG. 4 to a lower opening 12B, defined by the inward-bent lower extremity of wall 7cB and accommodating a support plug 13B.

The construction and functions of the modified through-type capacitors CA and CB of FIGS. 3 and 4 are similar to those of the through-type capacitor C of FIG. 2.

Figure 5:
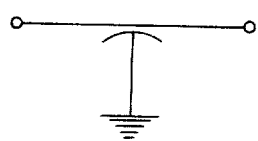
FIG. 5 is an electrical diagram representing an equivalent circuit of the through-type capacitor according to the present invention.
Figure 6:
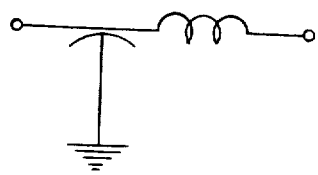
FIG. 6 is a diagram similar to FIG. 5, which particularly shows a modification thereof.

The through-type capacitor according to the present invention described in the foregoing may be represented by an equivalent circuit as shown in FIG. 5 when the insulating support plugs 13, 13A and 13B are made of non-magnetizable material; if the insulating support plugs 13, 13A and 13B are constituted of magnetizable material such as ferrite and the like, the through-type capacitor functions as an LC filter represented by the equivalent circuit shown in FIG. 6, the inductance being selected through alteration of the magnetizable material, and depending on necessity, another magnetizable member may further be provided at the side of the upper opening of the housing 7.

It is to be noted that the capacitor element 1 described as employed in the arrangements of FIGS. 2 to 4 is not limited in its configuration to the disc shape, but may be modified in various ways in its construction and dielectric materials so as to form, for example, a layer-built capacitor.

As is clear from the foregoing description, the through-type capacitor of the present invention has several advantages over the conventional through-type capacitors of the kind:

(a) By the provision of the insulating support plug, the solder joining the metallic housing 7 and the lower electrode 5 of the capacitor element 1 is prevented from reaching the central conductor member.

(b) Even when the central conductor member is bent for connection of the through-type capacitor to external circuits, the bending strain arising therefrom is not applied to the capacitor element 1 but is dispersed by the insulating support plug 13 of high strength, so that the capacitor element is advantageously protected from damage.

(c) The advantages of the through-type capacitor according to the present invention as described above indicate that the capacitor element can be compact and thin, and therefore, not only can favorable attenuation characteristics be imparted to the through-type capacitor in a still higher frequency range than with conventional through-type capacitors, but the capacitor itself can be miniaturized.

(d) Since the perfect filling of the interior of the capacitor with resin material through the lower opening of the metallic housing, which is difficult and has presented various problems in the prior art, is unnecessary with the present invention, manufacturing cost of the through-type capacitor is reduced, while poor withstand voltage characteristics and faulty insulation due to imperfect insertion of the resin material are eliminated.

(e) The through-type capacitor according to the present invention may be readily modified to be an LC filter through proper selection of the material for the support plug, the inductance value of which can be selected as desired.

Although the present invention has been fully described by way of example with reference to the attached drawings, it is to be noted that various changes and modifications are apparent to those skilled in the art. Therefore, unless otherwise such changes and modifications depart from the scope of the present invention as defined by the appended claims, they should be construed as included therein.

What is claimed is:

1. A method of manufacturing a through-type capacitor, comprising the steps of: inserting, in a metal cylindrical housing the top of which is open and the bottom of which has an opening, a plug with a central bore, so as to obstruct said opening at least partially; depositing a first string of solder on the interior of the bottom of said housing; placing on said first string of solder a dielectric member having a central bore and first and second electrodes on respective ones of two opposing surfaces thereof, so that said first electrode rests substantially on said first string of solder; depositing on said second electrode a second string of solder; inserting through both said central bore of said plug and of said dielectric member a rod-shaped conductor such that it projects from said housing for externally electrical connection, said conductor having a collar piece, and said collar piece resting substantially on said second string of solder; heating said strings of solder to melt them so that said conductor is electrically connected to said second electrode and said first electrode is electrically connected to the bottom of said housing; and filling a substantial portion of the volume defined by said housing with a resinous material.

2. The method of claim 1, further comprising the step of: disposing an annular sheet of electrically insulating material on the upper surface of said plug before the step of depositing said dielectric member and after the step of inserting said plug, so that said sheet is located between said plug and said dielectric member in the finished capacitor.

3. The method of claim 1, further comprising the step of: coating the upper surface of said plug with electrically insulative paint after the step of inserting said plug and before the step of depositing said dielectric member, so that said coating of paint separates said dielectric member from said plug.

4. The methods of claims 2 or 3, further comprising the step of: inserting enough resinous material into the spaces between said conductor and said plug and between said plug and the walls of said housing defining said opening in the bottom of said housing to seal off the interior of said housing completely.

5. A through-type capacitor for use in electrical and electronic equipment, said capacitor comprising:
a housing of metallic material having first and second openings and a stepped portion provided therebetween;
a capacitor element located in said housing, said capacitor element comprising a dielectric member having an opened end formed therein, and first and second electrode means formed on two opposite surfaces thereof, respectively;
a central conductor member inserted through said opening in said dielectric member and secured in such position, said central conductor member being electrically connected to said first electrode means, said second electrode means being electrically connected to the interior of said housing;
plug means through which said central conductor member extends and which is fixed with respect to said housing so as to obstruct said second opening of said housing at least partially, said plug means being made of a magnetizable material; and
a resin material closing said first opening of said housing.

6. A through-type capacitor for use in electrical and electronic equipment, said capacitor comprising:
a housing of metallic material having first and second openings and a stepped portion provided therebetween;
a capacitor element located in said housing, said capacitor element comprising a dielectric member having an opened end formed therein, and first and second electrode means formed on two opposite surfaces thereof, respectively;
a central conductor member inserted through said opening in said dielectric member and secured in such position, said central conductor member being electrically connected to said first electrode means, said second electrode means being electrically connected to the interior of said housing;
plug means through which said central conductor member extends and which is fixed with respect to said housing so as to obstruct said second opening of said housing at least partially;
resin material closing said first opening of said housing; and
an electrically insulating sheet member through which said central conductor member extends disposed between said dielectric member and said plug means.

7. A through-type capacitor for use in electrical and electronic equipment, said capacitor comprising:
a housing of metallic material having first and second openings and a stepped portion provided therebetween;
a capacitor element located in said housing, said capacitor element comprising a dielectric member having an opening formed therein, and first and second electrode means formed on two opposite surfaces thereof, respectively;
a central conductor member inserted through said opening in said dielectric member and secured in such position, said central conductor member being electrically connected to said first electrode means, said second electrode means being electrically connected to the interior of said housing;
plug means through which said central conductor member extends and which is fixed with respect to said housing so as to obstruct said second opening of said housing at least partially, said plug means having a surface facing said dielectric member, said surface being coated with an electrically insulating paint; and a resin material closing said first opening of said housing.

8. A through-type capacitor for use in electrical and electronic equipment, said capacitor comprising:

a housing of metallic material having first and second openings and a stepped portion provided therebetween;

a capacitor element located in said housing, said capacitor element comprising a dielectric member having an opening formed therein, and first and second electrode means formed on two opposite surfaces thereof, respectively;

a central conductor member inserted through said opening in said dielectric member and secured in such position, said central conductor member being electrically connected to said first electrode means, said second electrode means being electrically connected to the interior of said housing;

a plug means through which said central conductor member extends and which is fixed with respect to said housing so as to obstruct said second opening of said housing at least partially, said plug means being secured in said second opening of said housing at least partly by means of friction; and a resin material closing said first opening of said housing.

9. A through-type capacitor for use in electrical and electronic equipment, said capacitor comprising:

a housing of metallic material having first and second openings and a stepped portion provided therebetween, said second opening being defined by a cylindrical wall projecting from said housing, the interior of said cylindrical wall being threaded;

a capacitor element located in said housing, said capacitor element comprising a dielectric member having an opening formed therein, and first and second electrode means formed on two opposite surfaces thereof, respectively;

a central conductor member inserted through said opening in said dielectric member and secured in such position, said central conductor member being electrically connected to said first electrode means, said second electrode means being electrically connected to the interior of said housing;

plug means through which said central conductor member extends and which is fixed with respect to said housing so as to obstruct said second opening of said housing at least partially, said plug means being externally threaded, said plug means and said cylindrical wall engaging each other by means of said threads.

10. A through-type capacitor for use in electrical and electronic equipment, said capacitor comprising:

a housing of metallic material having first and second openings and a stepped portion provided therebetween, said housing including an outwardly projecting flange, the extremity of which is bent inward to define said second opening;

a capacitor element located in said housing, said capacitor element comprising a dielectric member having an opening formed therein, and first and second electrode means formed on two opposite surfaces thereof, respectively;

a central conductor member inserted through said opening in said dielectric member and secured in such position, said central conductor member being electrically connected to said first electrode means, said second electrode means being electrically connected to the interior of said housing;

plug means through which said central conductor member extends and which is fixed with respect to said housing so as to obstruct said second opening of said housing at least partially, said plug means being accommodated in the volume defined by said flange of said housing; and resin material closing said first opening of said housing.

* * * * *